(12) United States Patent
Yasuda

(10) Patent No.: US 11,923,442 B2
(45) Date of Patent: Mar. 5, 2024

(54) BIPOLAR TRANSISTOR WITH SEGMENTED EMITTER CONTACTS

(71) Applicant: TEXAS INSTRUMENTS INCORPORATED, Dallas, TX (US)

(72) Inventor: Hiroshi Yasuda, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/939,321

(22) Filed: Jul. 27, 2020

(65) Prior Publication Data

US 2021/0028300 A1 Jan. 28, 2021

Related U.S. Application Data

(60) Provisional application No. 62/878,768, filed on Jul. 26, 2019.

(51) Int. Cl.
| | |
|---|---|
| H01L 29/73 | (2006.01) |
| H01L 21/8249 | (2006.01) |
| H01L 27/06 | (2006.01) |
| H01L 29/08 | (2006.01) |
| H01L 29/10 | (2006.01) |
| H01L 29/417 | (2006.01) |

(Continued)

(52) U.S. Cl.
CPC ........ *H01L 29/737* (2013.01); *H01L 21/8249* (2013.01); *H01L 27/0623* (2013.01); *H01L 29/0817* (2013.01); *H01L 29/1004* (2013.01); *H01L 29/41708* (2013.01); *H01L 29/66318* (2013.01)

(58) Field of Classification Search
CPC .............. H01L 29/737; H01L 21/8249; H01L 27/0623; H01L 29/0817; H01L 29/1004; H01L 29/41708; H01L 29/66318; H01L 29/0692; H01L 29/0649; H01L 29/7378; H01L 29/732; H01L 29/0821; H01L 29/0804; H01L 29/42304; H01L 27/1022; H01L 27/2445; H01L 29/7322
See application file for complete search history.

(56) References Cited

U.S. PATENT DOCUMENTS

| | | | |
|---|---|---|---|
| 8,004,008 B2 * | 8/2011 | Takahashi | ............... H01L 24/06 |
| | | | 257/E29.174 |
| 8,450,179 B2 | 5/2013 | El-Kareh et al. | |

(Continued)

*Primary Examiner* — Shouxiang Hu
(74) *Attorney, Agent, or Firm* — Andrew R. Ralston; Frank D. Cimino

(57) ABSTRACT

An integrated circuit includes a transistor having a collector region, a base region and an emitter strip. The collector region includes layer of a semiconductor substrate doped with a dopant of a first conductivity type. The base region includes semiconductor layer over the semiconductor substrate, doped with a dopant of a second conductivity type. An emitter strip within the base region has a first width and is doped with a first dopant of the first conductivity type. A plurality of emitter contacts is located within the emitter strip. Each emitter contact has a second width less than the first width, and includes a second dopant of the first conductivity type. Each emitter contact is spaced from a nearest neighbor emitter contact by a portion of the emitter strip. In some examples the transistor has a common-emitter current gain greater than 3500.

34 Claims, 13 Drawing Sheets

(51) Int. Cl.
*H01L 29/66* (2006.01)
*H01L 29/737* (2006.01)

(56) References Cited

U.S. PATENT DOCUMENTS

| | | | |
|---|---|---|---|
| 2008/0169513 A1* | 7/2008 | Denison | H01L 27/0259 257/370 |
| 2015/0228643 A1* | 8/2015 | Song | H01L 29/861 257/526 |
| 2015/0270256 A1* | 9/2015 | Edwards | H01L 27/0259 257/577 |

* cited by examiner

BIPOLAR TRANSISTOR WITH SEGMENTED EMITTER CONTACTS

CROSS-REFERENCE TO RELATED APPLICATIONS

This application claims the benefit of provisional Application Ser. No. 62/878,768, filed Jul. 26, 2019, which is herein incorporated by reference in its entirety.

TECHNICAL FIELD

The described invention relates to the field of microelectronic devices. More particularly, but not exclusively, this invention relates to high-gain bipolar transistors with stable beta (ß) across different device sizes.

BACKGROUND

Super-beta bipolar transistors may have a common-emitter current gain, B, in excess of 1000. Some such transistors include a base formed from SiGe compound semiconductor. Aspects of such devices are described in U.S. Pat. No. 8,450,179, which is incorporated herein in its entirety.

SUMMARY

The following provides a summary of described examples. This summary is not an extensive overview of the disclosed examples, and is neither intended to identify key or critical elements of the invention, nor to delineate the scope thereof. Rather, the primary purpose of the summary is to present some concepts of the invention in a simplified form as a prelude to a more detailed description that is presented later.

A transistor includes an emitter region, a base region and a collector region. The collector region includes a semiconductor having a first conductivity type over a semiconductor substrate. The base region includes a semiconductor having a second conductivity type, which may include silicon-germanium (SiGe), over the semiconductor substrate. An emitter strip having the first conductivity type is located within the base region, the emitter strip having a first width and including a dopant of the first conductivity type. A plurality of emitter contacts is located within the emitter strip. Each emitter contact has a second width less than the first width and includes a dopant of the first conductivity type such that the carrier concentration in the emitter contacts is greater than the carrier concentration in the emitter strip. Each emitter contact is spaced from a nearest neighbor emitter segment by a portion of the emitter strip. The transistor may be a portion of an integrated circuit that includes other circuit components, e.g. MOS transistors, resistors, and/or capacitors.

In another aspect an integrated circuit includes first NPN bipolar transistor having a first beta, e.g. a common-emitter current gain, greater than 3500, and a second NPN bipolar transistor having a second beta greater than 3500. The first transistor includes an emitter strip having a first length, and the second transistor includes an emitter strip having a second length at least twice the first length. The second beta differs from the first beta by no more than 10% of the first beta.

DETAILED DESCRIPTION

The present disclosure is described with reference to the attached figures. The figures may not be drawn to scale and they are provided merely to illustrate the disclosure. Several aspects of the disclosure are described below with reference to example applications for illustration, in which like features correspond to like reference numbers. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events may be required to implement a methodology in accordance with the present disclosure.

Figure 1A:
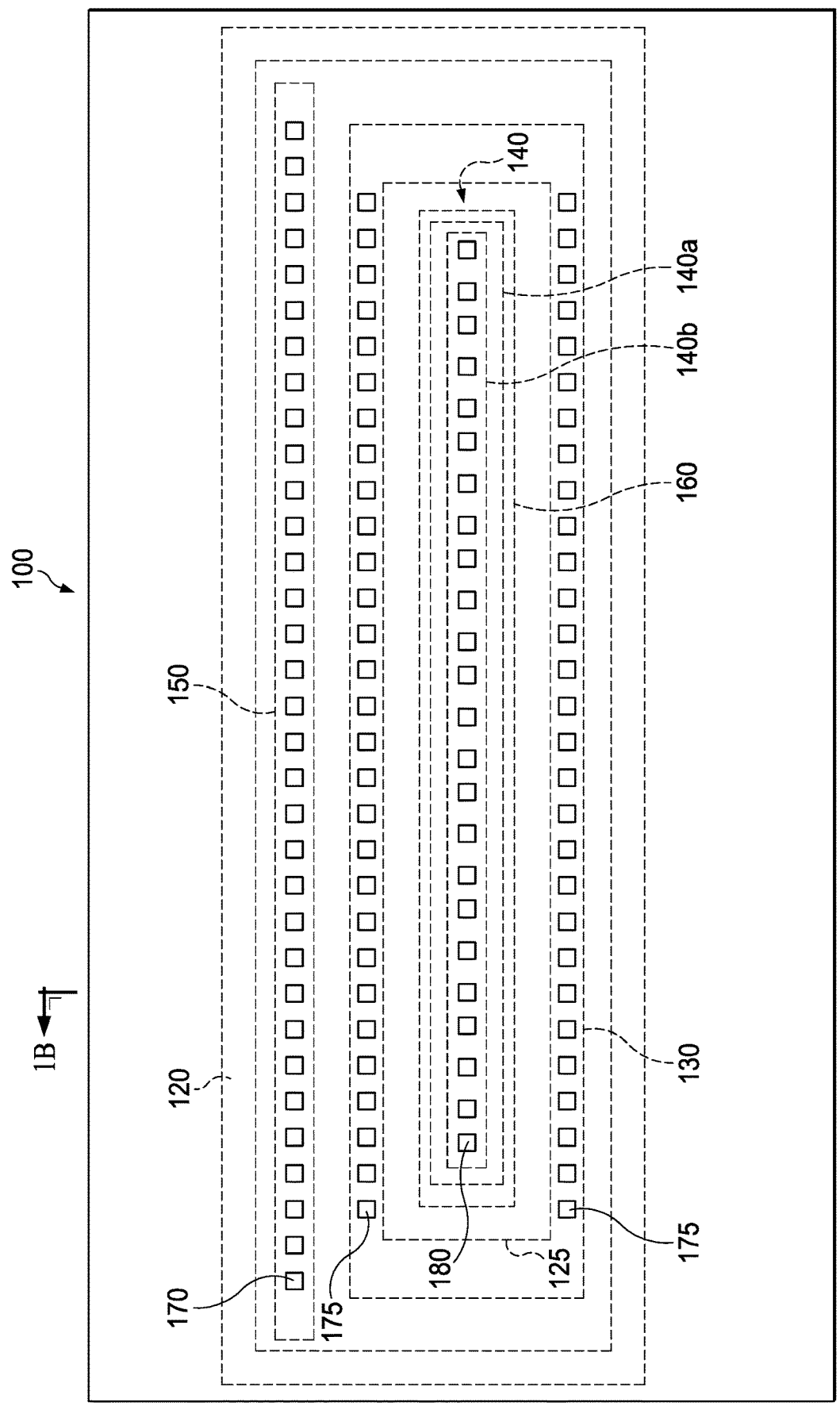
FIGS. 1A and 1B present plan and sectional views of a prior art bipolar transistor, including an unsegmented emitter.
Figure 1B:
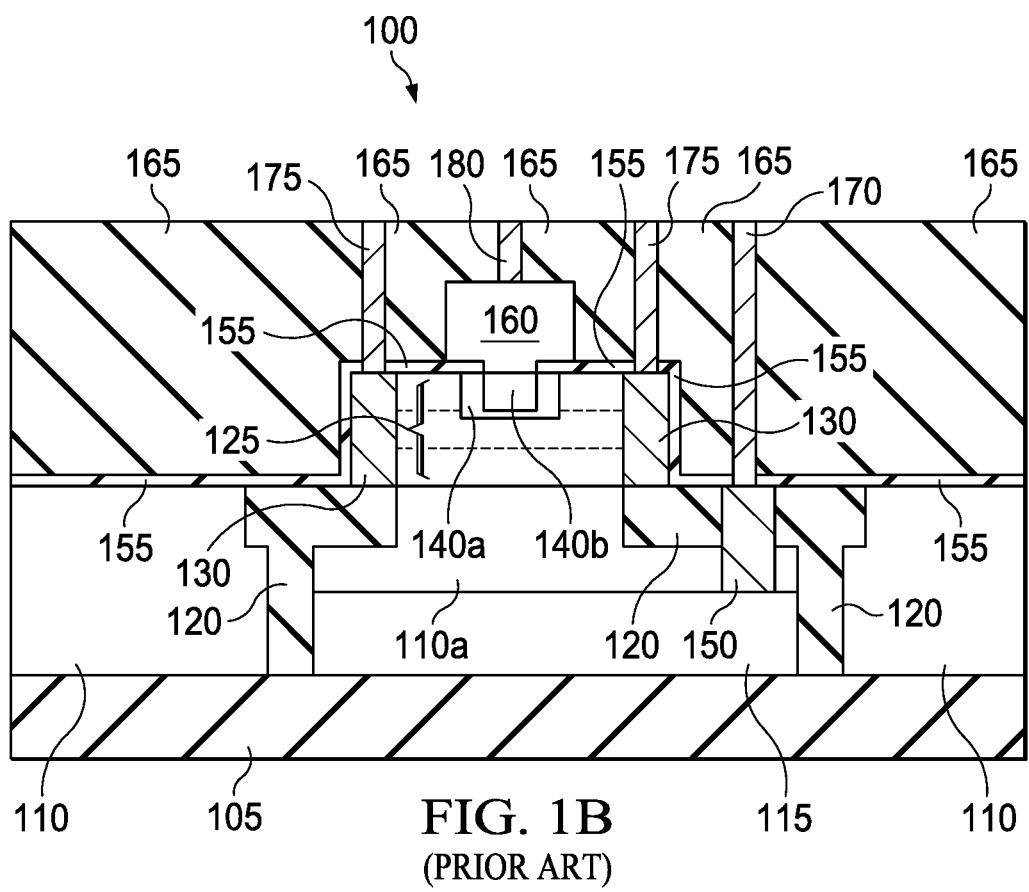

FIGS. 1A and 1B respectively illustrate a plan view and sectional view of a representative bipolar transistor 100 that may be a high-ß transistor having a common-emitter current gain greater than 1000. The following discussion refers to both figures concurrently. Some features shown in FIG. 1A are configured in a racetrack layout, so while FIG. 1B may show multiple instances of some such features in sectional view, such instances may be two different locations of the same racetrack feature.

The transistor 100 is formed over a handle substrate, such as a silicon wafer, on which a buried oxide (BOX) layer 105 is formed. An N-type silicon layer 110 over the BOX layer 105 includes an N-buried layer (NBL) 115 having a higher dopant concentration than the silicon layer 110. Optionally the silicon layer 110 may be an epitaxial layer. Dielectric isolation structures 120 extend from the surface of the epitaxial layer toward the BOX layer 105. A collector electrode 150, e.g. an N-type sinker, extends from the wafer surface to the N-buried layer 115. A portion 110a of the silicon layer 110 is laterally surrounded by the dielectric isolation structures 120. The N-buried layer 115 and the silicon layer portion 110a may operate as a collector region of the transistor 100.

A base region 125 is located over the silicon layer portion 110a, and includes a SiGe layer sandwiched between a top silicon (Si) layer and a bottom Si layer. The base region 125 is P-type, and may be doped with boron (B). A polysilicon base electrode 130 surrounds and provides a conductive electrical connection to the base region 125. A dielectric layer 155 covers the surface of the silicon layer 110, the base electrode 130 and the base region 125. In some examples the dielectric layer 155 may be a composite of a silicon nitride layer and a silicon oxide layer. A polysilicon emitter electrode 160, referred to hereinafter as emitter poly 160, electrically connects to the base region 125, e.g. via a p-n junction. A dielectric layer 165, e.g. phosphorous-doped silicon dioxide, covers the emitter poly 160 and the dielectric layer 155. Vias 170, 175 and 180 respectively provide vertical conductive paths from an interconnect layer (not shown) to the collector electrode 150, base electrode 130 and the emitter poly 160.

The emitter poly 160 contacts the top of the base region 125 through an opening in the dielectric layer 155. The opening provides a connection to an emitter region that includes an SBEMIT region 140a and an NSIC region 140b. The SBEMIT region 140a and the NSIC region 140b may be collectively referred to as emitter region 140. The SBEMIT region 140a may be formed by implanting and diffusing an N-type dopant such as phosphorous (P), arsenic (As) or antimony (Sb) into the base region 125. The NSIC region 140b is formed by doping a polysilicon layer from which the emitter poly 160 may be formed with an N-type dopant such as P, As or Sb, and then diffusing the N-type dopant from that polysilicon layer into the already-formed SBEMIT region 140a. Thus the SBEMIT region 140a extends deeper and laterally (parallel to the surface of the underlying substrate) further than the NSIC region 140b, while the NSIC region 140b has a greater concentration of N-type dopant. Together, the SBEMIT region 140a and the NSIC region 140b serve as the emitter of the transistor 100. Additional details may be found in U.S. Pat. No. 8,450,179 (hereinafter "the '179 patent").

The length (along the long axis of the NSIC region 140a) of the transistor 100 may be selected depending on design requirements, e.g. current capacity. However, it has been found that the ß of the transistor 100 varies as a function of length. In one example, a variant with a length of 4.2 μm may have a ß value of 1875, while a variant with a length of 26 μm (all other factors being constant) may have a ß value of about 1285, a reduction of about 30%. This characteristic is thought to result from the change of area ratio of the SBEMIT region 140a to the NSIC region 140b. In one nonlimiting example, this ratio is about 5.9 for the 4.2 μm variant and about 4.7 for the 26 μm variant, again a reduction of about 30%. This characteristic is undesirable from a design perspective, as it may require a designer to compensate for the reduction of B.

Figure 2A:
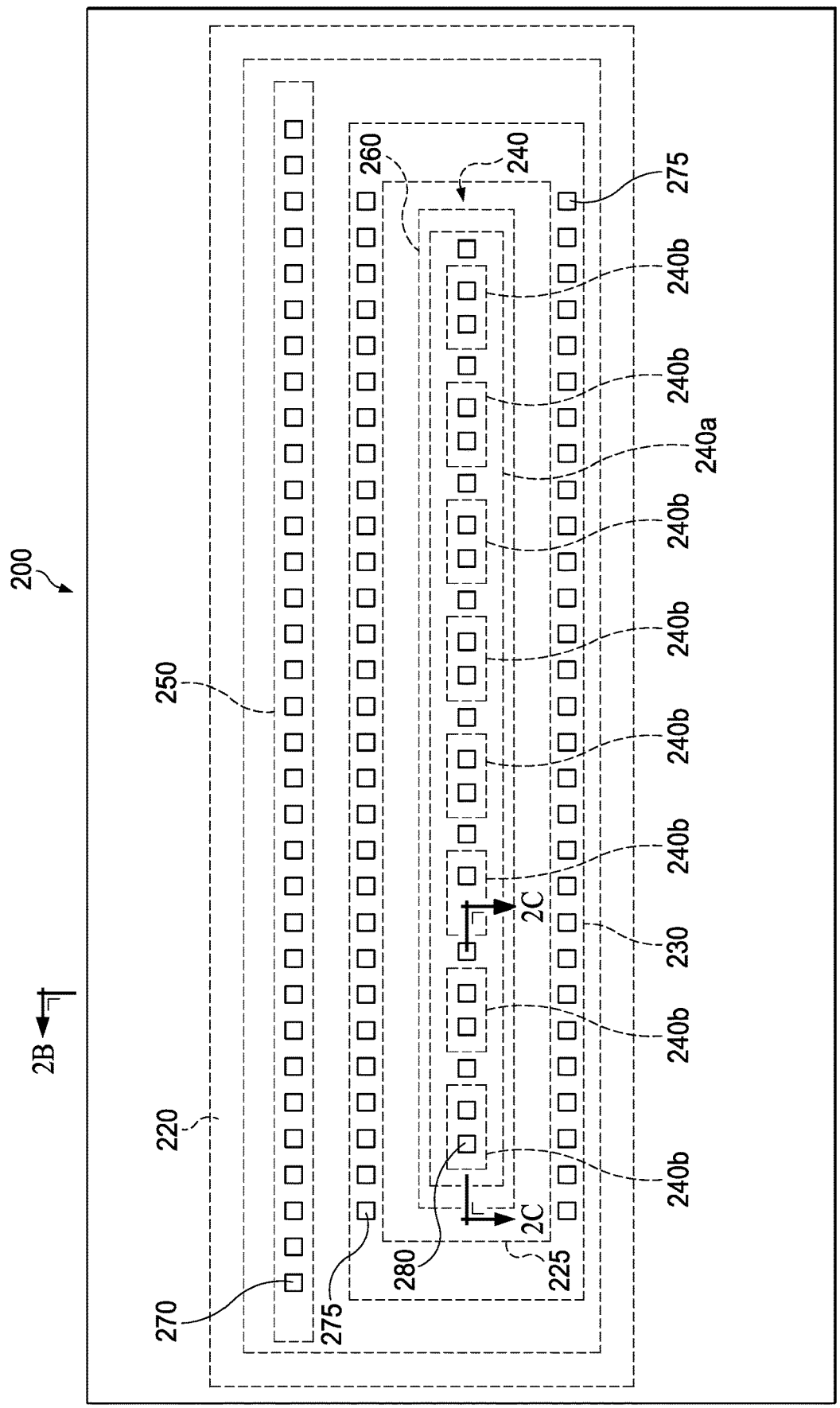
FIGS. 2A-2C illustrate plan and sectional views an example of a bipolar transistor of the disclosure, including eight emitter segments.
Figure 2B:
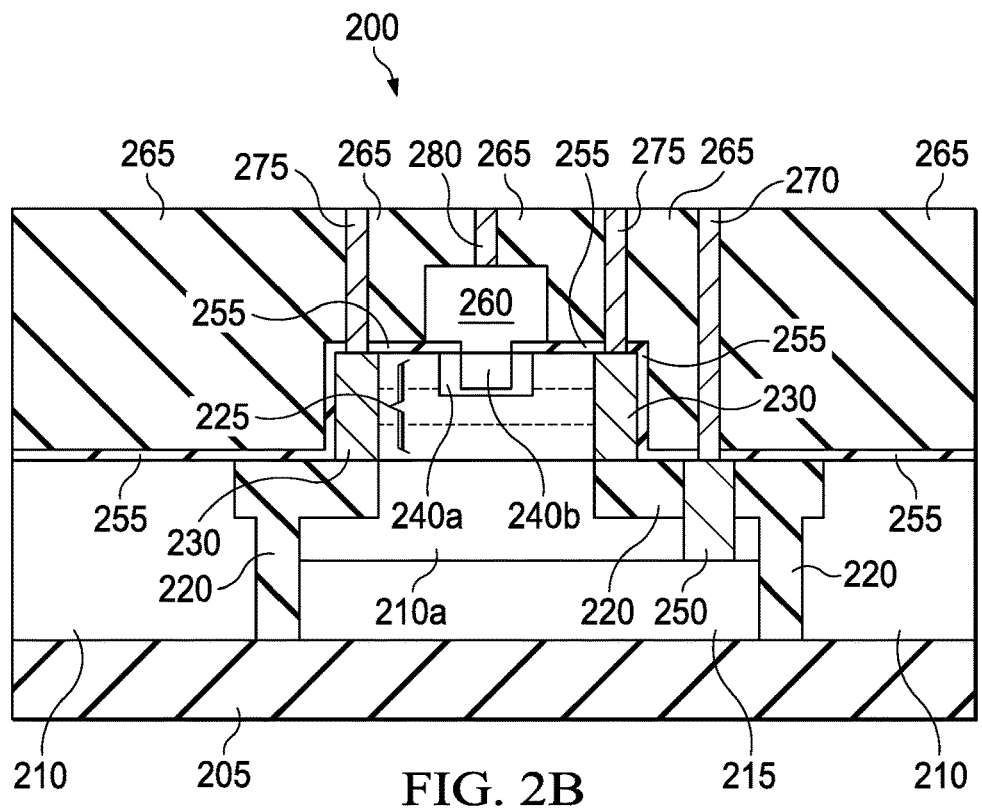
Figure 2C:
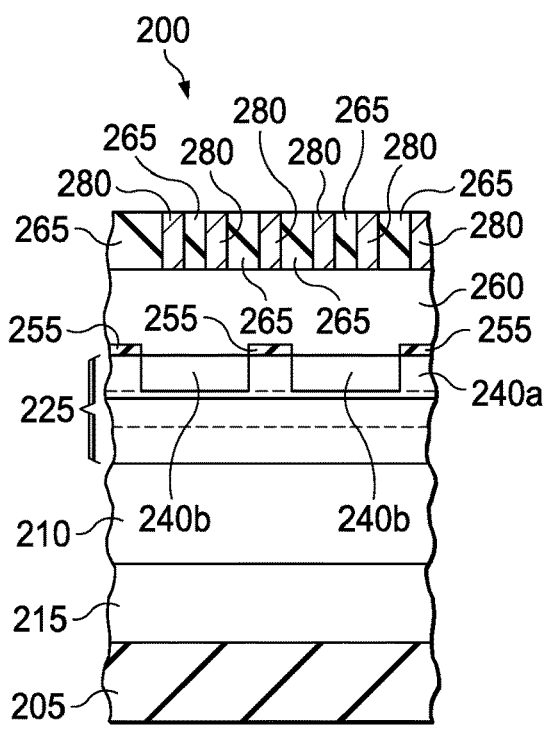

FIGS. 2A-2C illustrate a plan view and sectional views of an NPN transistor 200 in one example of the disclosure that advantageously reduces the undesirable effect of transistor scaling on B. In some examples, the transistor 200 may be a super-beta transistor, e.g. having a gain in excess of 1000. This example is provided and described without implied limitation to the specific configuration of features. The following discussion refers to FIGS. 2A-2C concurrently. Features of the transistor 200 that are analogous to those of the transistor 100 are similarly labeled with "2XX". Thus, the transistor 200 includes a BOX layer 205, silicon layer 210, silicon layer portion 210a, N-buried layer 215, isolation structures 220, base region 225, polysilicon extrinsic base 230, emitter 240, collector electrode 250, dielectric layer 255, polysilicon emitter electrode (or emitter poly) 260, dielectric layer 265 and metal vias 270, 275 and 280. Optionally the BOX layer 205 may be omitted. The emitter 240 includes an emitter strip 240a and segmented emitter contacts 240b. (A single instance of a segmented emitter contact may be referred to as an emitter contact 240b.) With regard to the base region 225, examples described below include a heterogeneous layer including SiGe layer between two Si layers. However, the scope of the disclosure is not so limited, and may include transistors that include homogenous base layer including only an elemental semiconductor such as silicon. The base region 225 may be in situ doped with $1E18$ $cm^{-3}$ with boron, in one example. While the transistor 200 is shown as an example of an NPN transistor, those skilled in the pertinent art will appreciate that a similar PNP transistor may be formed by using appropriate dopants and processes.

The emitter strip 240a is analogous to the SBEMIT region 140a, but for the transistor 200 the segmented emitter contacts 240b are discontinuous regions that are each otherwise analogous to the NSIC region 140b. The dopant concentrations in the emitter strip 240a and segmented emitter contacts 240b may be similar to those described in the '179 patent with respect to the SBEMIT region 140a and the NSIC region 140b. For example and without implied limitation, the emitter strip 240a may be doped to have a majority carrier concentration of about $1E19$ $cm^{-3}$, and the segmented emitter contacts 240b may be doped to have a majority carrier concentration of about $1E20$ $cm^{-3}$. Such doping may be implemented with one or more dopant species of the appropriate conductivity type (N-type or P-type). For example, N-type doping may be implemented with one or more of P, As or Sb, and P-type doping may be implemented with boron.

The inventor has discovered that the variation of ß with transistor length may be substantially reduced by segmenting the NSIC region into a plurality of segmented emitter contacts 240b, each emitter segment being separated from a nearest-neighbor emitter segment by an unmodified portion of the emitter strip (SBEMIT region) 240. By doing so, the total area of the emitter strip 240a and the segmented emitter contacts 240b the may be independently determined, allowing for targeting a desired value of ß for the transistor 200. While the principles of the disclosure may be particularly suitable for super-beta transistors have a gain of at least 1000, or at least 3500, such principles may be applied advantageously to bipolar transistors of lesser gain that otherwise fall within the scope of the disclosure. As evident in FIG. 2A, the segmented emitter contacts 240b are spaced apart from each other along the long axis of the emitter strip 240a. The length (along their long axis) and width (along their short axis) of the segmented emitter contacts 240b may be independently determined, as well as the spacing between the segmented emitter contacts 240b. Moreover, the segmented emitter contacts 240b may each have a different length and width, and may be placed within the emitter strip 240a in a manner that is different for different transistor lengths, providing the ability to reduce variation of ß for the differently sized transistors. This aspect is addressed in greater detail below.

FIG. 2B shows a sectional view along the short axis of one segmented emitter contact 240b. This sectional view is superficially similar to that of FIG. 1B. However, FIG. 2C shows a sectional view along the long axes of a pair of nearest-neighbor segmented emitter contact 240b. Two features are noted: first, the nearest-neighbor segmented emitter contacts 240b are separated by an unmodified portion of the emitter strip 240a; second, a portion of the dielectric layer 255 is located between the nearest-neighbor segmented emitter contacts 240b. The polysilicon emitter poly 260 contacts the emitter 240 only through the openings through the dielectric layer 255 corresponding to each segmented emitter contact 240b. In some examples, not shown, the emitter poly 260 may be omitted and the metal vias 280 may directly contact the segmented emitter contacts 240b. In such examples, the metal vias may be trench vias of appropriate size, and the segmented emitter contacts 240b may be doped by implanting a dopant through openings in the dielectric 265 prior to filling the openings with metal.

The inventor has found that the additional degree of freedom provided by the segmented emitter contacts 240b allows variants of the transistor 200 to be designed that have a significantly reduced dependence of ß on transistor length. Moreover, the value of ß may be increased relative to an unsegmented emitter such as in the transistor 100, by reducing the total area of contact between the NSIC region and the SBEMIT region.

For the transistor configurations shown in Table I, the ß ranges from about 3940 to about 4000, a range of about 2% over several production lots. It is believed that this relatively small range results from the ability to select a different ratio of the emitter strip 240a (SBEMIT) area to the total (NSIC) area of the segmented emitter contacts 240b. For example, area ratios corresponding to Table I are 9.6, 9.6, 9.3 and 9.0 respectively for transistors of length 26.4 µm, 13.9 µm, 7.8 µm and 4.6 µm.

TABLE I

| SBEMIT (µm) | NSIC (µm) | L | SP1 | SP2 | SP3 | SP4 | SP5 | SP6 | SP7 | SP8 | ß | ß/ß$_{26}$ |
|---|---|---|---|---|---|---|---|---|---|---|---|---|
| 2.2 × 26.4 | 0.4 × 24.6 | 1.9 | 0.7 | 1.3 | 1.3 | 1.4 | 1.4 | 1.4 | 1.3 | 1.3 | 3972 | 1.00 |
| 2.2 × 13.9 | 0.4 × 12.1 | 2.0 | 0.7 | 1.35 | 1.4 | 1.35 | — | — | — | — | 4001 | 1.01 |
| 2.2 × 7.8 | 0.4 × 6.0 | 2.3 | 0.7 | 1.4 | — | — | — | — | — | — | 3986 | 1.00 |
| 2.2 × 4.6 | 0.4 × 2.8 | 2.8 | 0.7 | — | — | — | — | — | — | — | 3936 | 0.99 |

Figure 3:
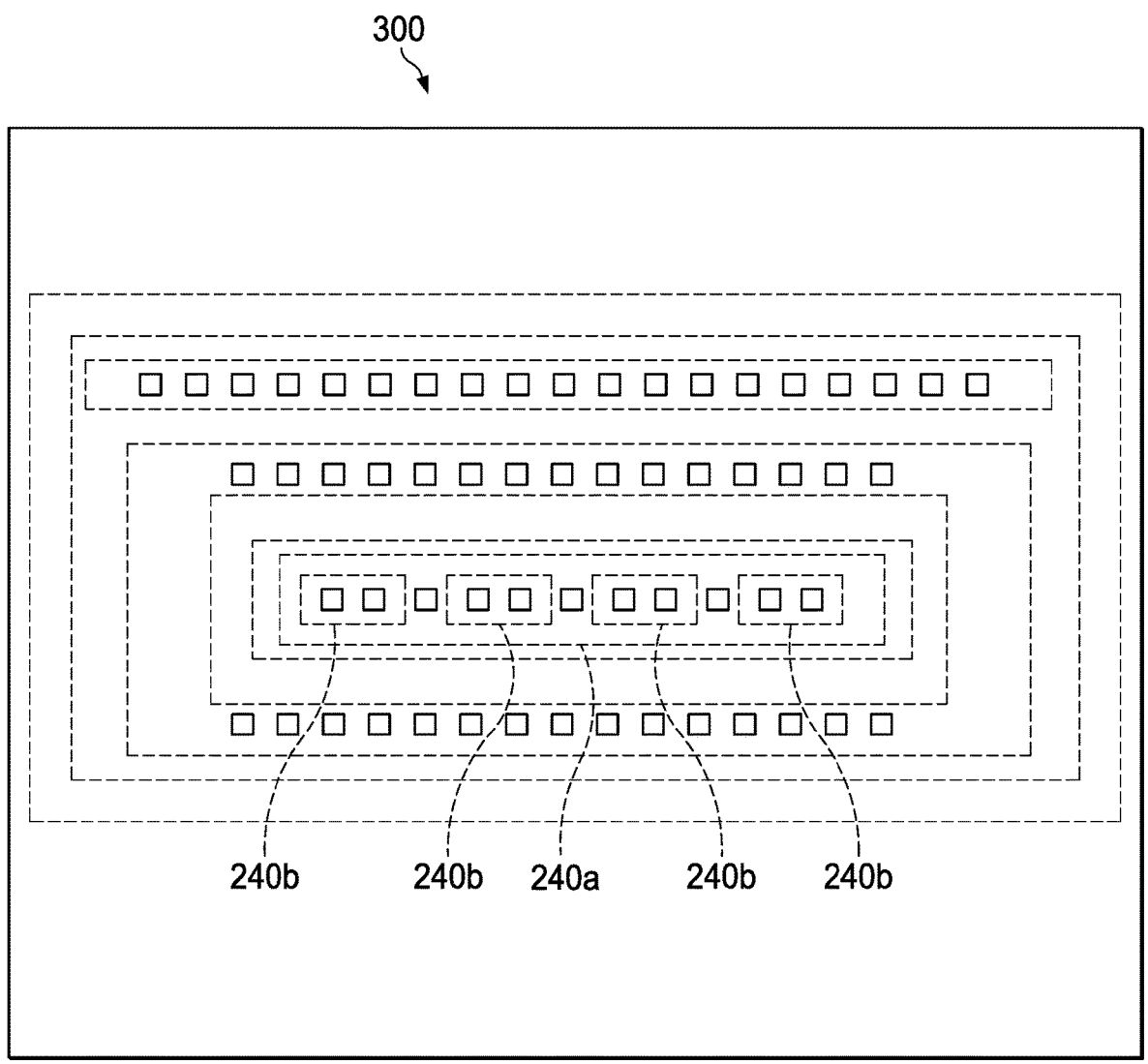
FIG. 3 illustrates an example of a bipolar transistor of the disclosure, including four emitter segments.
Figure 4:
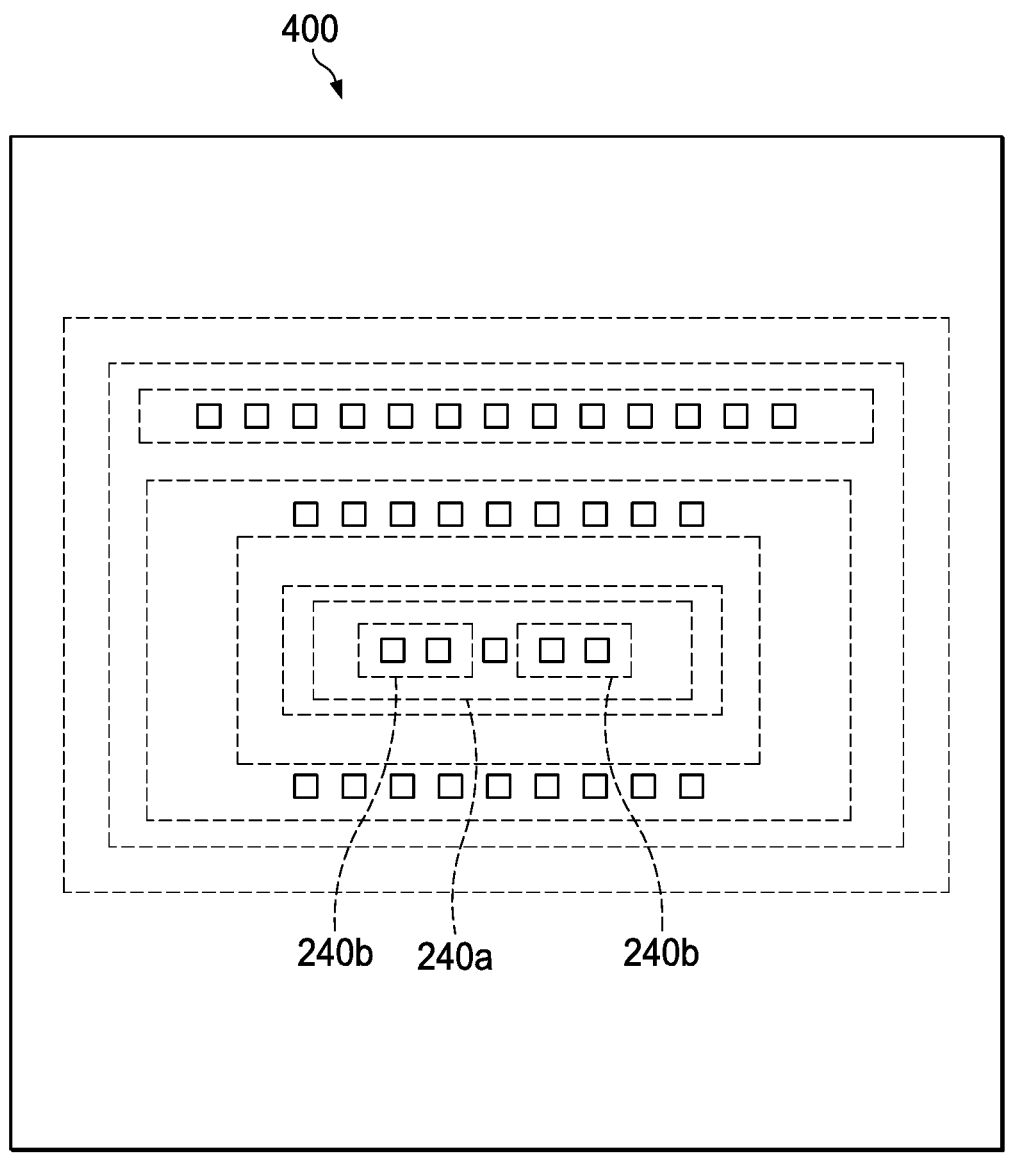
FIG. 4 illustrates an example of a bipolar transistor of the disclosure, including two emitter segments.
Figure 5:
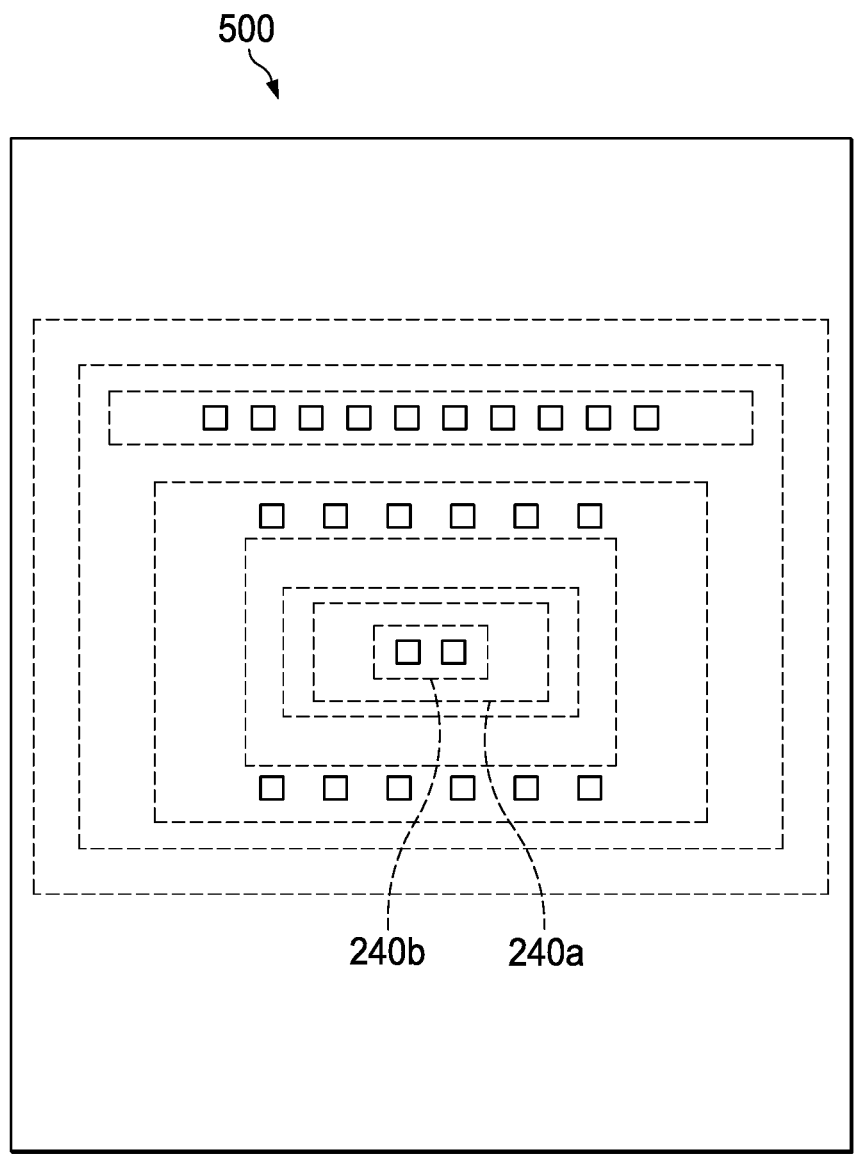
FIG. 5 illustrates an example of a bipolar transistor, including a single emitter segment.

The transistor 200, which includes eight segmented emitter contacts 240b, may be representative without implied limitation of a transistor with a length of 26 µm. A transistor 300 in FIG. 3, which includes four segmented emitter contacts 240b, may be representative of a transistor with a length of 13.5 µm. A transistor 400 in FIG. 4, which includes two segmented emitter contacts 240b, may be representative of a transistor with a length of 7.4 µm. A transistor 500 in FIG. 5, which includes a single emitter contact 240b, may be representative of a transistor with a length of 4.2 µm.

Figure 6:
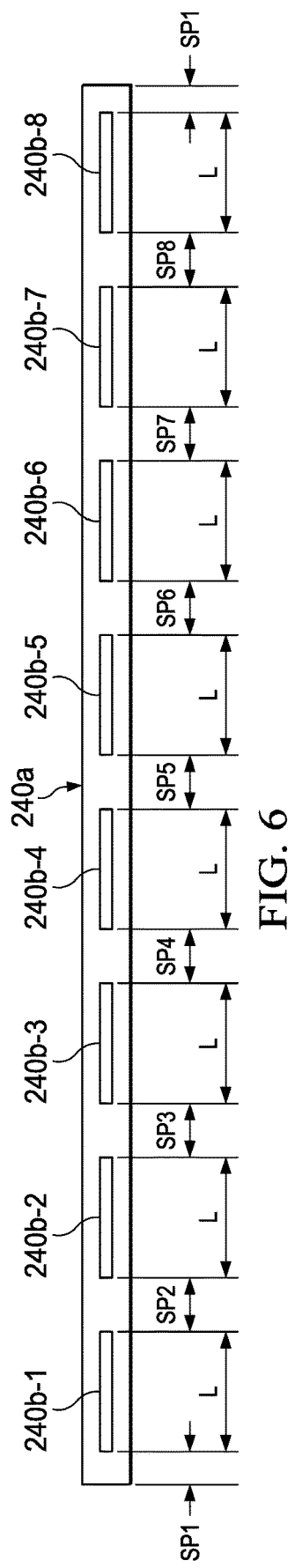
FIG. 6 presents an example of eight emitter segments, with various physical extents labeled for the discussion.

FIG. 6 illustrates one manner of accounting for the dimensions and placement of the segmented emitter contacts 240b. Eight segmented emitter contacts 240b are shown, but variants with a lower number of emitter segments may be interpreted in this scheme. The eight segmented emitter contacts 240b are designated 240b-1 . . . 240b-8. In the illustrated example, all of the segmented emitter contacts 240b-1 . . . 240b-8 are shown having equal lengths, but variations within the scope of the disclosure may include emitter segments with unequal lengths. The emitter contact 240b-1 is spaced from a first end of the emitter strip 240a by a first distance SP1. The emitter contact 240b-2 is spaced from the emitter contact 240b-1 by a distance SP2. Similarly, emitter contacts 240b-3 . . . 240b-8 are respectively spaced by SP3, SP4, SP5, SP6, SP7 and SP8. The emitter contact 240b-8 is spaced from a second end of the emitter strip 240a by a distance SP9. Each of the segmented emitter contacts 240b-1 . . . 240b-8 has a length L, though as previously stated options in which the emitter segments have different lengths are within the scope of the disclosure. In the illustrated example each emitter segment has a long axis, and the emitter segments are aligned along their long axes. However the scope of the disclosure includes examples in which the emitter segments are arranged in other ways, such as the long axis of one or more emitter segments offset from the long axis of one or more other emitter segments.

Table I presents example values of the lengths of the segmented emitter contacts 240b, and spacing between adjacent segmented emitter contacts 240b, for four example transistor lengths exemplified by FIG. 2A, FIG. 3, FIG. 4 and FIG. 5. These values are presented without implied limitation, and those skilled in the pertinent art will appreciate that different configurations of length and spacing may be used within the scope of the disclosure. Factors that may be relevant in determining these values may include, for example, target ß value, target drive current, and technology design rule constraints.

In these examples, the space between adjacent emitter segments is larger than the space between each terminal contact (e.g. 240b-1, 240b-8) and the corresponding end of the emitter strip, e.g. 240a, but the scope of the disclosure includes examples in which the space between adjacent emitter segments is equal to or smaller than spaces between the first/last emitter segment and the corresponding end of the emitter strip. The spaces between segments, e.g. SP2 . . . SP7, may be equal in some cases or may be different. In the 26.4 µm and 13.9 µm examples in Table I, one or more of the spaces nearer the middle of the emitter strip 240a are larger than one or more spaces toward the ends of the emitter strip 140a. In some cases, such a configuration may provide improved current uniformity and/or better matching of ß among transistors of different size. In this context, transistor size is determined by the length of the emitter strip 240a (SBEMIT). Relative to the ß for the 26.4 µm transistor (ß$_{26}$), the ß of the other transistors is within about ±1%. Furthermore, the ß of the transistors using the segmented emitter is higher than the previous baseline, e.g. by at least about 100%. The higher ß may be accounted for by a greater ratio of area of the emitter strip 240a to the total area of the segmented emitter contacts 240b. In one nonlimiting example, this area ratio in the previous baseline ranged from about 5.9 for a 4.2 µm transistor to about 4.7 for a 26 µm transistor, whereas for transistors with the segmented emitter contacts 240b this ratio ranged in one example from 9.0 for the 4.6 µm transistor to 9.6 for the 26.4 µm transistor. This ability to increase the ß while maintaining a small difference between the ß among transistors of different size is a reflection of the independent control of the ratio of SBEMIT area to NSIC area provided by the disclosed structures.

Comparing the 26.4 µm transistor to the 13.9 µm transistor, the length of the former is about twice the length of the latter, while the two transistors have a ß within about ±1%. Comparing the 26.4 µm transistor to the 7.8 µm transistor, the length of the former is about three times the length of the latter, while the two transistors also have a ß within about ±1%. Comparing the 26.4 µm transistor to the 4.6 µm transistor, the length of the former is about six times the length of the latter, while the two transistors also have a ß within about ±1%. Thus it is seen that the ß values of the transistors exemplified by Table I have very stable values of ß across a range of sizes, and distinct advantage to a designer using such transistors in a same circuit layout.

Figure 7A:
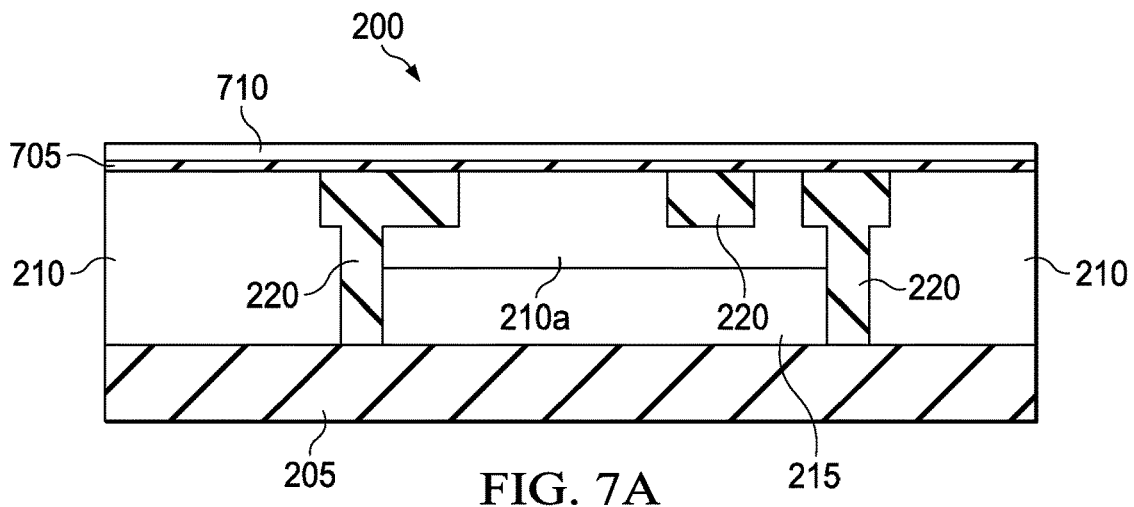
FIGS. 7A-7J present a device of the disclosure at various stages of manufacturing.

Turning now to FIGS. 7A-7J, an example is provided of a process sequence that may produce an NPN transistor of the disclosure. Those skilled in the art may readily modify the disclosed process sequence to produce a PNP transistor within the scope of the disclosure. FIG. 7A presents a sectional view of the transistor 200 after several stages of manufacturing. Feature references of FIG. 2B are retained for continuity of the description without implied limitation. An oxide layer 705 and a polysilicon layer 710 have been formed, possibly by conventional methods, over the silicon layer 210, collector electrode 250 (e.g. an N-type sinker) and isolation structures 220. Optionally the polysilicon layer 710 is formed concurrently with formation of a gate electrode layer for MOS transistors on other areas of the substrate supporting the transistor 200. Similarly, the oxide layer 705 may be formed during formation of a gate dielectric layer for the MOS transistors. Optionally the N-type sinker may be formed in a racetrack configuration surrounding silicon layer portion 210a.

Figure 7B:
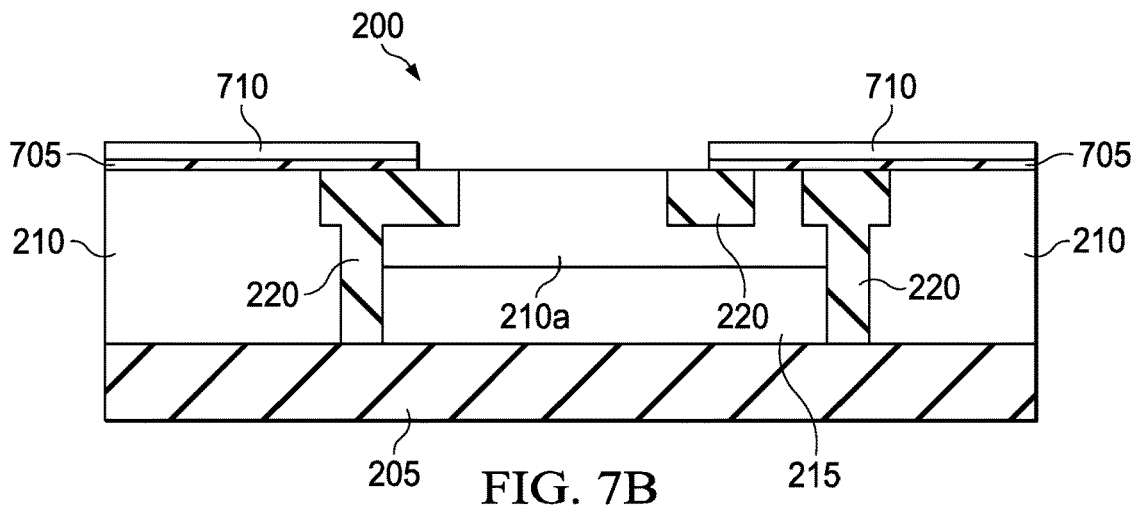

In FIG. 7B the polysilicon layer 710 and the oxide layer 705 have been patterned, e.g. by conventional masking and etch processing, to expose a portion of the silicon layer portion 210a and the isolation structures 220.

Figure 7C:
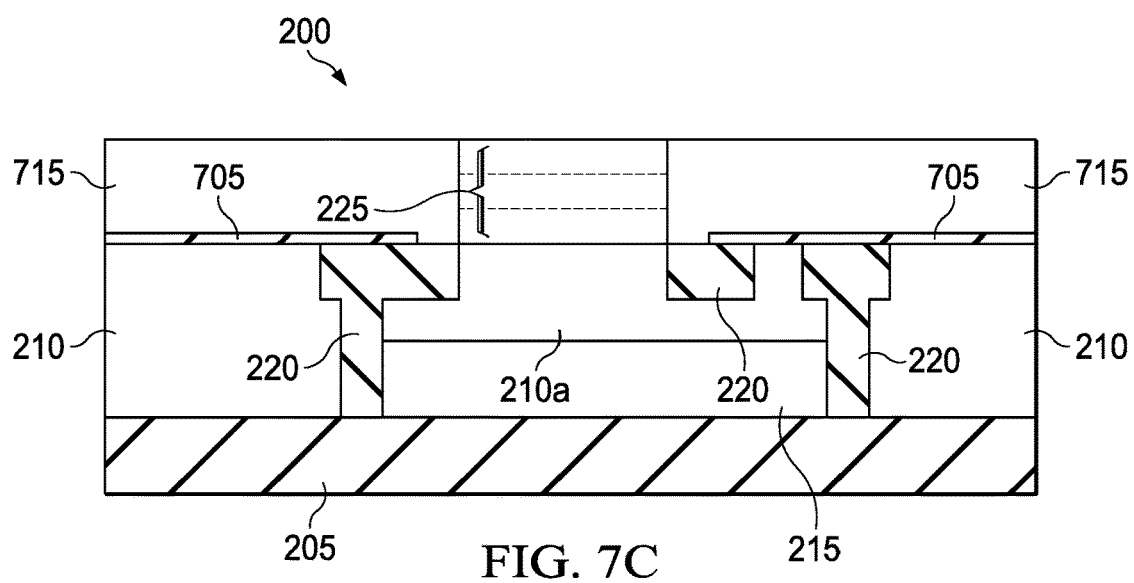

In FIG. 7C, a non-selective epitaxial growth process has been performed to produce the base region 225. The growth process causes the polysilicon layer 710 to become a thicker polysilicon layer 715 over the oxide layer 705 and the isolation structures 220. Over the silicon layer portion 210a the epitaxial growth process results in crystalline material growth. By control of the source feedstock during the growth process a bottom layer of Si is formed, followed by a layer of SiGe, and then followed by a top layer of Si. In one example, the bottom Si layer may be about 40 nm thick, the SiGe layer may be about 140 nm thick, and the top Si layer may be about 30 nm thick. The SiGe layer may be P-doped in situ with B, which also provides some dopant to the polysilicon layer 710. The material layers in the base region 225 are not labeled in subsequent figures to reduce clutter.

Figure 7D:
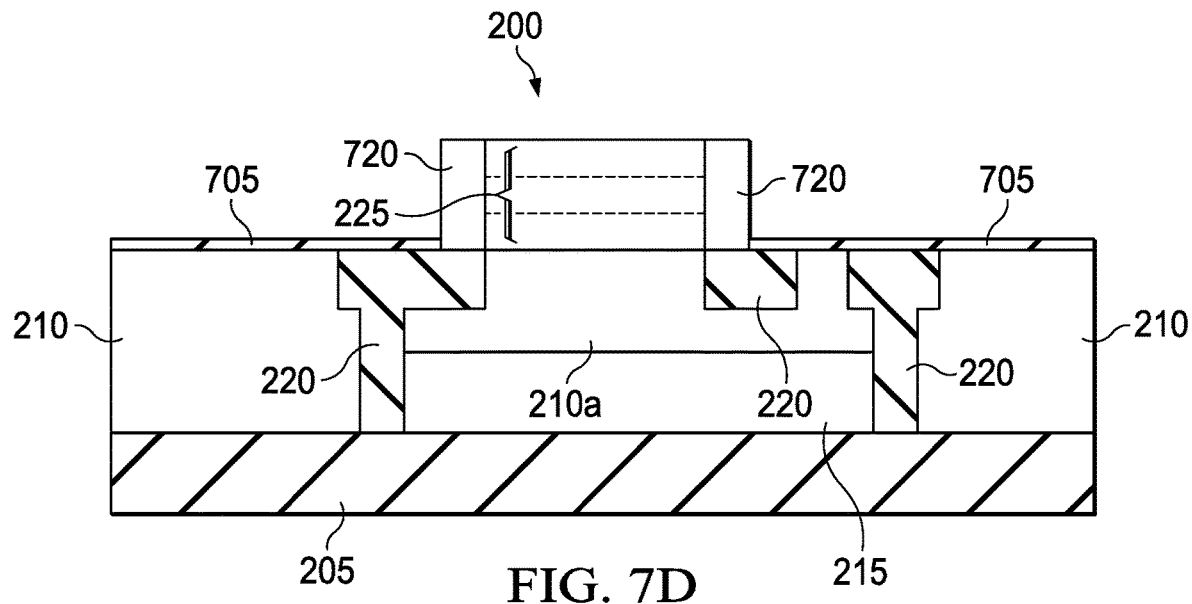

In FIG. 7D, the polysilicon layer 710 has been partially removed, e.g. by plasma etch. The dielectric layer 705 and the base region 225 are exposed by the removal. Polysilicon portions 720 remain over the isolation structures 220.

Figure 7E:
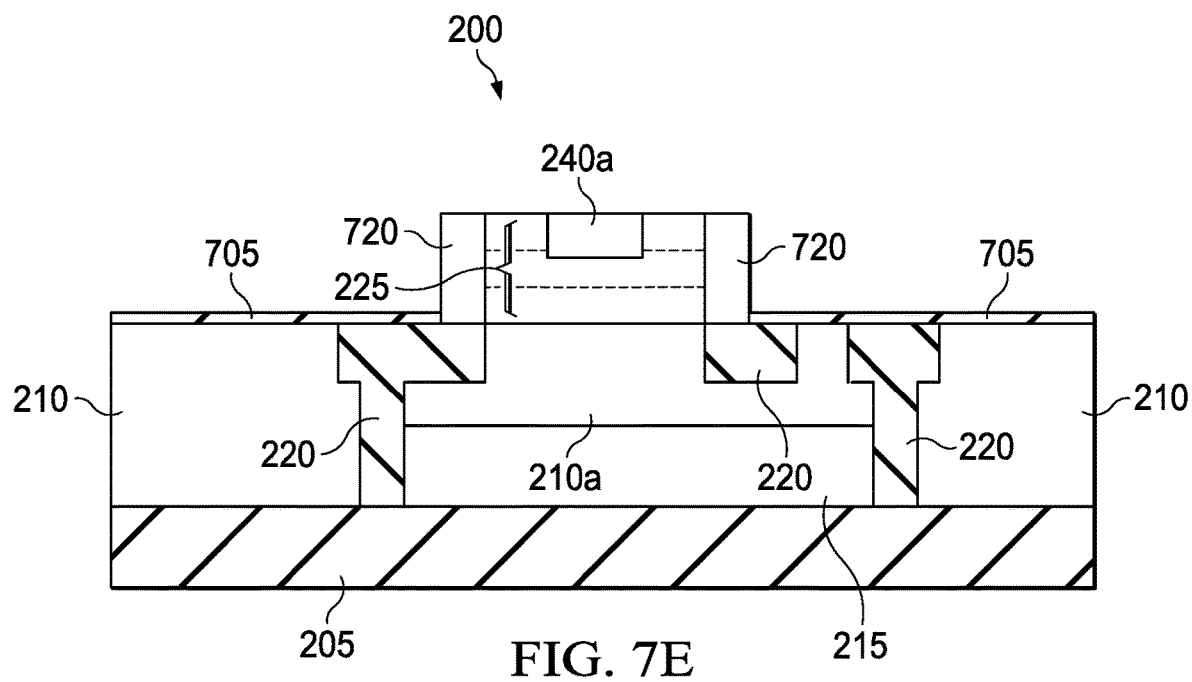

In FIG. 7E, the emitter strip 240a has been formed, e.g. by conventional resist patterning followed by implanting As into the polysilicon layer 710. Optionally, P or Sb may be used as the dopant. The emitter strip 240a extends through the top Si layer of the base region 225 into the SiGe layer.

Figure 7F:
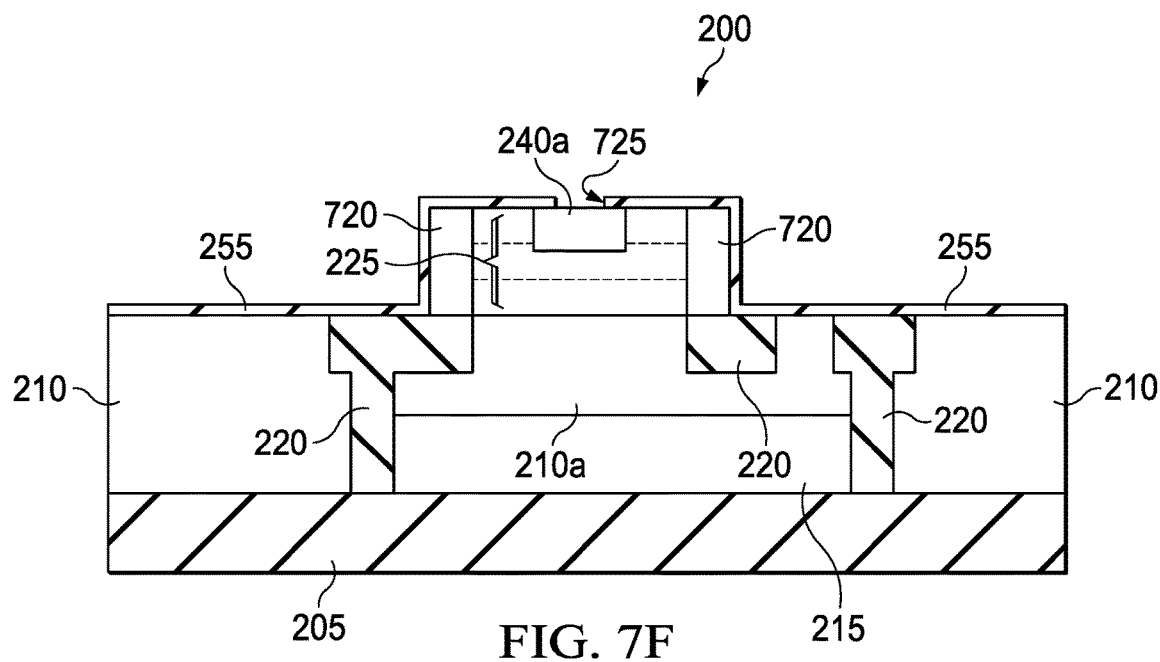

In FIG. 7F, the dielectric layer 255 has been formed over the base region 225 and the emitter strip 240a. The dielectric layer 255 may include, e.g. a 50 nm layer of silicon oxide over a 50 nm layer silicon nitride, both optionally formed by conventional processing. The dielectric layer 705 is incorporated into the dielectric layer 255. An opening 725 has been formed by resist patterning followed by dielectric etch. The opening 725 is one of a number of openings in the dielectric layer 255 each corresponding to one of the segmented emitter contacts 240b. This aspect is described more fully below.

Figure 7G:
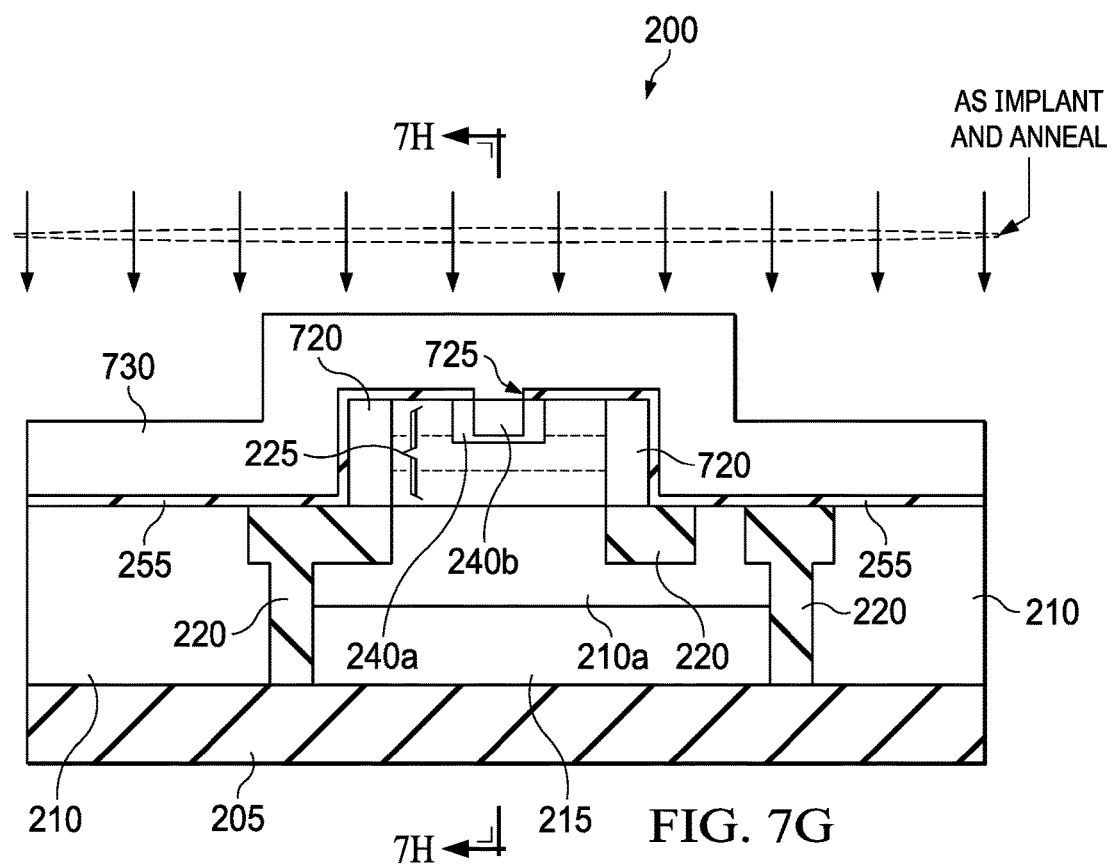

In situ In FIG. 7G, a polysilicon layer 730 has been formed over the emitter strip 240a and the dielectric layer 255. In the illustrated example, the polysilicon layer 730 has been doped with an N-type dopant, e.g. As, via ion implantation, to a concentration of about 1E20 cm$^{-3}$. Alternatively the polysilicon layer 730 may be doped in situ. In another alternative, the polysilicon layer 730 may be formed by an in situ doped epitaxial process, which would be expected to result in crystalline portions over the segmented emitter contacts 240b. In such examples the resulting layer may be referred to as polysilicon layer 730 while recognizing some epitaxial crystalline portions may be present in the layer. The polysilicon layer 730 is then annealed, which causes the dopant to diffuse into the emitter strip 240a through the opening 725. In various examples the dopant diffuses at least to the depth of the SiGe layer, but does not extend to the bottom of the emitter strip 240a. The resulting illustrated doped region within the emitter strip 240a is a single instance of the segmented emitter contacts 240b.

Figure 7H:
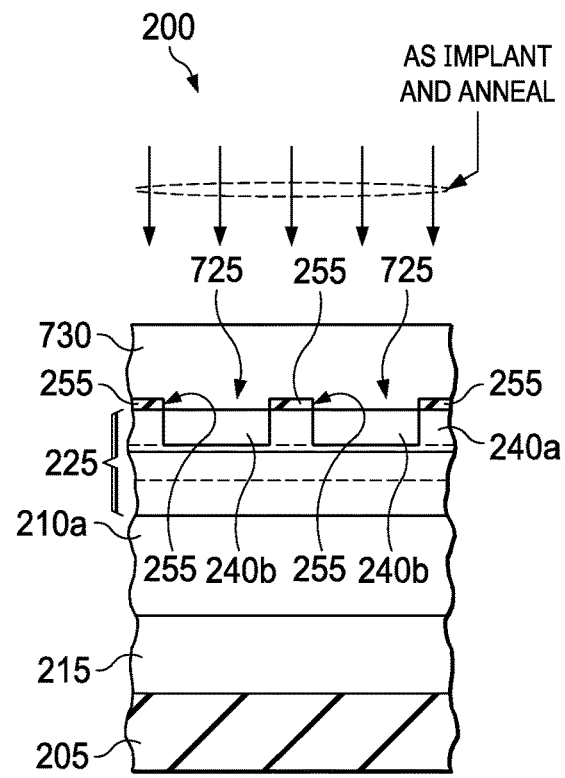

FIG. 7H provides a view orthogonal to that of FIG. 7G, including two adjacent instances of the segmented emitter contacts 240b. A portion of the dielectric layer 255 remains between the segmented emitter contacts 240b, which substantially excludes N-type dopant from the emitter strip 240a between the segmented emitter contacts 240b.

Figure 7I:
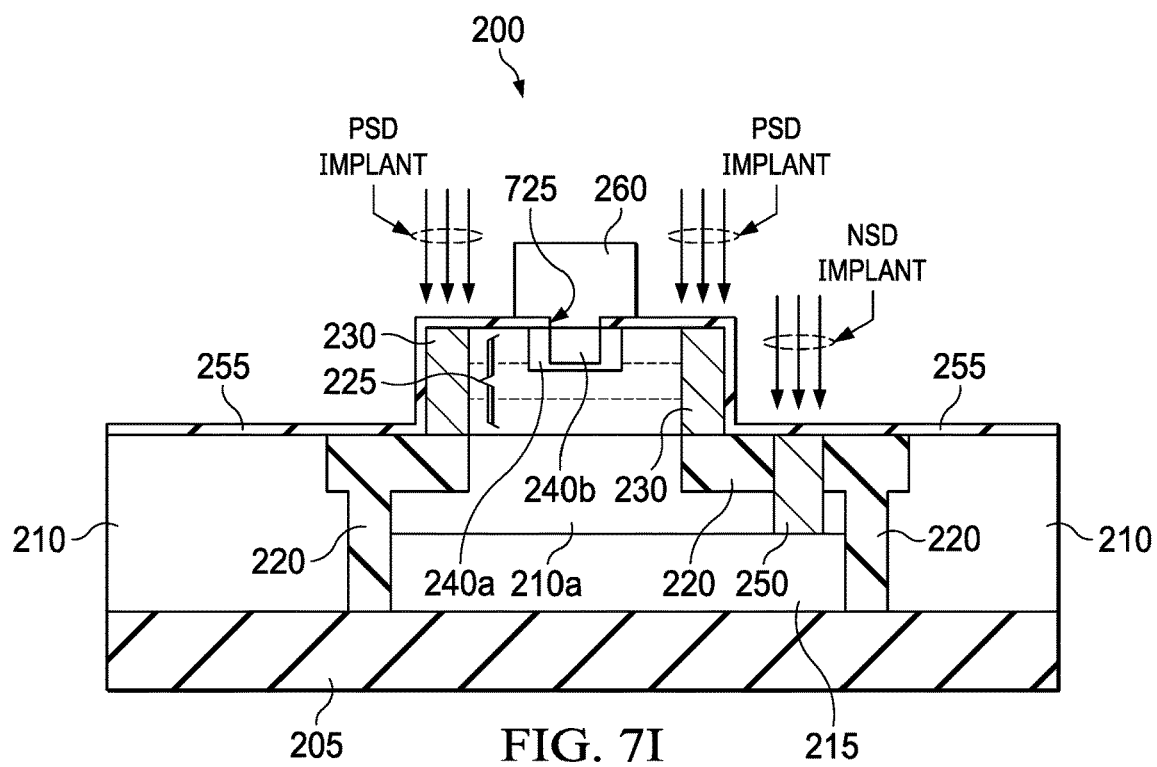

FIG. 7I returns to the previous section viewpoint, and shows the transistor 200 after the polysilicon layer 730 has been patterned to produce the emitter poly 260 and to expose the dielectric layer 255. A P-type dopant is implanted into the polysilicon portions 720 using a patterned photoresist layer to define a first implanted area, thereby creating the extrinsic base 230. Similarly an N-type dopant is implanted into silicon layer portion 210a using a patterned photoresist layer to define a second implanted area, thereby creating the collector electrode 250. Optionally the P-type dopant may be implanted by a PSD (P-type source/drain) process used to form PMOS transistors elsewhere on the substrate supporting the transistor 200. Similarly, optionally the N-type dopant may be implanted by an NSD (N-type source/drain) process used to form NMOS on the substrate. Without limitation the P-type dopant may be B, and the N-type dopant may be P.

Figure 7J:
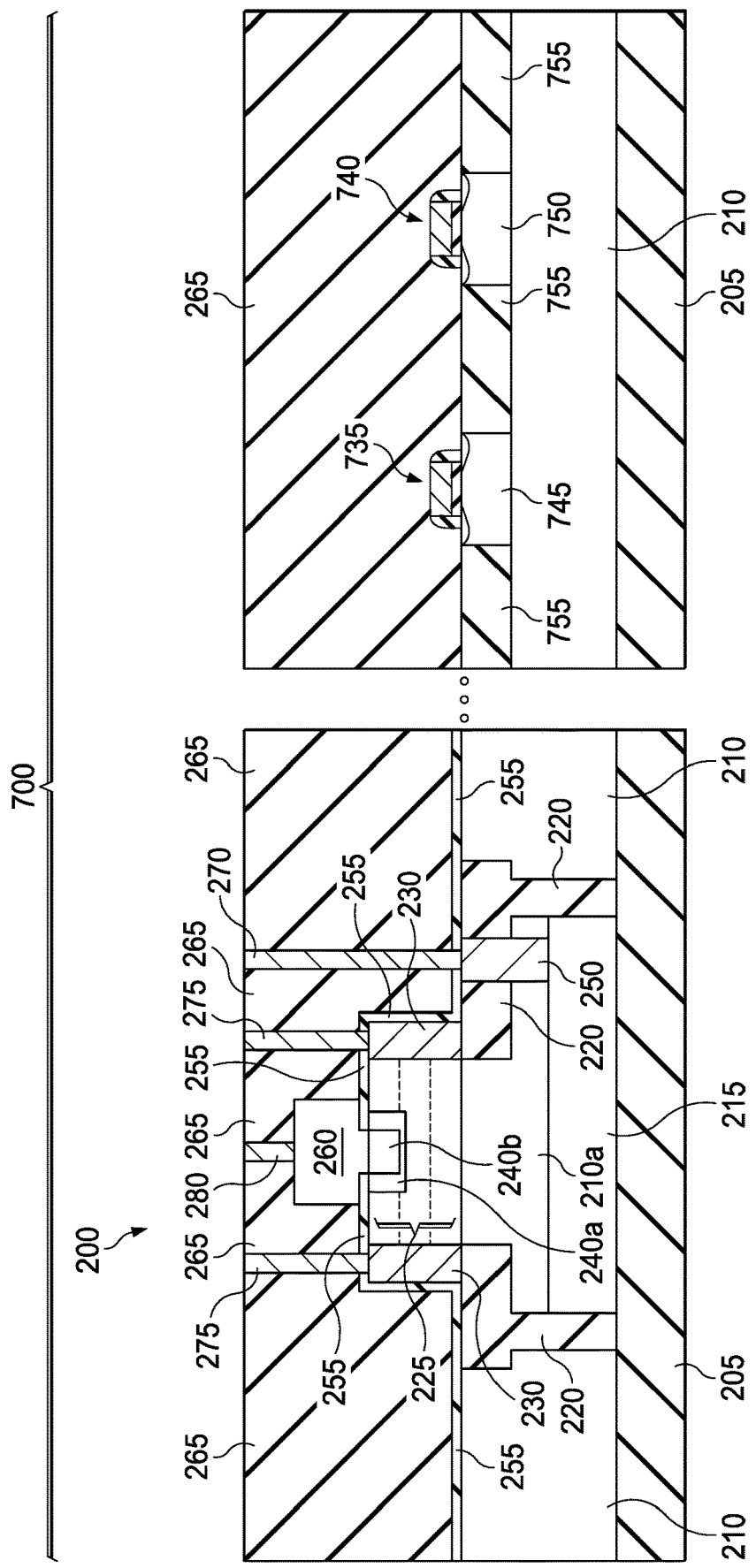

Finally, FIG. 7J illustrates the transistor 200 after formation of the dielectric layer 265 and the vias 270, 275, and 280. Also shown in simplified form are a representative planar NMOS transistor 735 and a representative planar PMOS transistor 740. The NMOS transistor 735 includes a P-type well 745 and unreferenced NSD regions that may be formed concurrently with the collector electrode 250. Similarly the PMOS transistor 740 includes an N-type well 750 and unreferenced PSD regions that may be formed concurrently with the extrinsic base 230. The wells 745 and 750 are isolated from each other and other devices by isolation structures 755. Other structures sometimes used to form such transistors are well-known and omitted for clarity. The transistors 200, 735 and 740 are located in an integrated circuit 700, to which the transistors are connected by interconnect layers above the dielectric layer 265. The transistor 200 and one or both of the transistors 735 and 740 are configured to cooperate to perform a circuit function of the integrated circuit 700.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:
1. An integrated circuit, comprising:
a collector including a collector region having a first conductivity type extending into a semiconductor substrate having a top surface;

a base including a base region located above the top surface of the semiconductor substrate and having a different second conductivity type;

an emitter including an emitter strip within the base region, the emitter strip having a first width and comprising a first dopant with the first conductivity type and having a first dopant concentration;

a dielectric layer touching the top surface of the semiconductor substrate, a sidewall of the base region and a top surface of the base region; and a plurality of segmented emitter contacts in a single column within the emitter strip, each segmented emitter contact having a second width less than the first width and comprising a second dopant with the first conductivity type and having a greater second dopant concentration, each segmented emitter contact being spaced from a nearest neighbor segmented emitter contact by a portion of the emitter strip.

2. The integrated circuit of claim 1, wherein each segmented emitter contact has a long axis, and the segmented emitter contacts are aligned along their long axes.

3. The integrated circuit of claim 1, wherein the first dopant is As and the second dopant is As.

4. The integrated circuit of claim 1, wherein the emitter, base and collector define a super-beta bipolar transistor with beta greater than 3500.

5. The integrated circuit of claim 1, wherein the emitter, base and collector define a bipolar transistor, and further comprising a planar MOS transistor formed over the substrate, the bipolar transistor and the planar MOS transistor is configured to cooperate to perform a circuit function.

6. The integrated circuit of claim 1, wherein the plurality of segmented emitter contacts includes eight emitter segments.

7. The integrated circuit of claim 1, further comprising an As-doped emitter electrode that touches each segmented emitter contact through a corresponding opening in the dielectric layer.

8. The integrated circuit of claim 1, wherein the first conductivity type is N-type and the second conductivity type is P-type.

9. The integrated circuit of claim 1, wherein the base region includes a heterogeneous layer including a SiGe layer between two Si layers.

10. The integrated circuit of claim 1, wherein the plurality of segmented emitter contacts includes at least first, second and third segmented emitter contact, and a first space between the first and second segmented emitter contacts is larger than a second space between the second and third segmented emitter contacts.

11. The integrated circuit of claim 1, wherein the emitter strip has opposing short sides and opposing long sides, the segmented emitter contacts include a first segmented emitter contact and a last segmented emitter contact, the first and last segmented emitter contacts spaced apart from the respective short sides by a same first distance, and the first segmented emitter contact spaced apart from its nearest neighbor segmented emitter contact by a greater second distance and the last segmented emitter contact spaced apart from its nearest neighbor emitter contact by the greater second distance.

12. The integrated circuit of claim 11, wherein the nearest neighbor of the first segmented emitter contact and the nearest neighbor of the last segmented emitter contact are a same third segmented emitter contact.

13. The integrated circuit of claim 11, wherein the first segmented emitter contact is the nearest neighbor of the last segmented emitter contact and the last segmented emitter contact is the nearest neighbor of the first segmented emitter contact.

14. The integrated circuit of claim 11, further comprising a plurality of interior segmented emitter contacts between the first and last segmented emitter contacts, wherein the plurality of interior segmented emitter contacts are evenly spaced apart by a distance greater than the first distance and the second distance.

15. The integrated circuit of claim 11, further comprising a plurality of interior segmented emitter contacts between the first and last segmented emitter contacts, wherein a first subset of the interior segmented emitter contacts are spaced apart from nearest neighbor segmented emitter contacts by the second distance and a second subset of the interior segmented emitter contacts are spaced apart from nearest neighbor segmented emitter contacts by a third distance greater than the second distance.

16. An integrated circuit, comprising:
    a collector region having a first conductivity type over a semiconductor substrate;
    a base region having a different second conductivity type over the collector region;
    an emitter strip within the base region, the emitter strip having opposing short sides having a first width and opposing long sides, the emitter strip having the first conductivity type and a first majority carrier concentration;
    a dielectric layer that conformally extends along a top surface of the semiconductor substrate, a sidewall of the base region and a top surface of the emitter strip; and
    a plurality of segmented emitter contacts having the first conductivity type arranged in a single column within the emitter strip, the segmented emitter contacts having a greater second majority carrier concentration and being spaced apart along a length of the emitter strip.

17. The integrated circuit of claim 16, further comprising a polysilicon emitter electrode that touches the segmented emitter contacts through openings in the dielectric layer.

18. The integrated circuit of claim 16, wherein the first majority carrier concentration is about $1E19$ $cm^{-3}$ and the second majority carrier concentration is about $1E20$ $cm^{-3}$.

19. The integrated circuit of claim 16, wherein the base region is located over a top surface of the semiconductor substrate.

20. The integrated circuit of claim 16, wherein the segmented emitter contacts are surrounded laterally by a portion of the emitter strip having the first majority carrier concentration.

21. The integrated circuit of claim 16, wherein a ratio of a lateral area of the emitter strip to a total lateral area of the segmented emitter contacts is at least 9.

22. The integrated circuit of claim 16, wherein the segmented emitter contacts include first and second segmented emitter contacts, and a third segmented emitter contact that is a nearest neighbor to both the first and second segmented emitter contacts, the first and second segmented emitter contacts spaced apart from the respective short sides by a same first distance, and the first and second segmented emitter contacts spaced apart from the third segmented emitter contact by a greater second distance.

23. The integrated circuit of claim 16, wherein the segmented emitter contacts include first and second segmented emitter contacts spaced apart from the respective short sides by a same first distance, and the first segmented emitter contact is the nearest neighbor of the second segmented emitter contact and the second segmented emitter contact is the nearest neighbor of the first segmented emitter contact.

24. The integrated circuit of claim 16, wherein the segmented emitter contacts include first and second segmented emitter contacts spaced apart from the respective short sides by a same first distance, the first segmented emitter contact spaced apart from its nearest neighbor segmented emitter contact by a greater second distance and the second segmented emitter contact spaced apart from its nearest neighbor segmented emitter contact by the greater second distance, and further comprising a plurality of interior segmented emitter contacts between the first and second segmented emitter contacts, wherein the plurality of interior segmented emitter contacts are evenly spaced apart by a distance greater than the first distance and the second distance.

25. The integrated circuit of claim 16, wherein the segmented emitter contacts include first and second segmented emitter contacts spaced apart from the respective short sides by a same first distance, and further comprising a plurality of interior segmented emitter contacts between the first and second segmented emitter contacts, wherein a first subset of the interior segmented emitter contacts are spaced apart from nearest neighbor segmented emitter contacts by a greater second distance and a second subset of the interior segmented emitter contacts are spaced apart from nearest neighbor segmented emitter contacts by a third distance greater than the second distance.

26. An integrated circuit, comprising:
a semiconductor substrate having a top surface;
an electrode extending into the semiconductor substrate from the top surface to a collector region having a first conductivity type;
a base region having a different second conductivity type extending above the top surface over the collector region;
an emitter strip within the base region, the emitter strip having opposing short sides having a first width and opposing long sides, the emitter strip having the first conductivity type and a first majority carrier concentration;
a dielectric layer touching the top surface of the semiconductor substrate, a sidewall of the base region and a top surface of the emitter strip; and
a plurality of segmented emitter contacts arranged in a single column within the emitter strip and including a first emitter contact and a last emitter contact, each segmented emitter contact having a second width less than the first width and having the first conductivity type and a greater second majority carrier concentration, the segmented emitter contacts being spaced apart from nearest neighbor segmented emitter contacts by a portion of the emitter strip having the first majority carrier concentration, the segmented emitter contacts including a first segmented emitter contact in the column and a last segmented emitter contact in the column, the first and last segmented emitter contacts spaced apart from the respective short sides by a same first distance, and the first segmented emitter contact spaced apart from its nearest neighbor segmented emitter contact by a greater second distance and the last segmented emitter contact spaced apart from its nearest neighbor segmented emitter contact by the greater second distance.

27. The integrated circuit of claim 26, wherein the dielectric layer insulates the emitter strip from a polysilicon emitter electrode between adjacent ones of the segmented emitter contacts.

28. The integrated circuit of claim 26, wherein the second majority carrier concentration is about ten times the first majority carrier concentration.

29. The integrated circuit of claim 26, wherein a ratio of a lateral area of the emitter strip to a total lateral area of the segmented emitter contacts is at least 9.

30. The integrated circuit of claim 26, wherein the base region includes a heterogeneous layer including a SiGe layer between two Si layers.

31. The integrated circuit of claim 26, wherein the nearest neighbor of the first segmented emitter contact and the nearest neighbor of the last segmented emitter contact are a same third segmented emitter contact.

32. The integrated circuit of claim 26, wherein the first segmented emitter contact is the nearest neighbor of the last segmented emitter contact and the last segmented emitter contact is the nearest neighbor of the first segmented emitter contact.

33. The integrated circuit of claim 26, further comprising a plurality of interior segmented emitter contacts between the first and last segmented emitter contacts, wherein the plurality of interior segmented emitter contacts are evenly spaced apart by a distance greater than the first distance and the second distance.

34. The integrated circuit of claim 26, further comprising a plurality of interior segmented emitter contacts between the first and last segmented emitter contacts, wherein a first subset of the interior segmented emitter contacts are spaced apart from nearest neighbor segmented emitter contacts by the second distance and a second subset of the interior segmented emitter contacts are spaced apart from nearest neighbor segmented emitter contacts by a third distance greater than the second distance.

* * * * *